(12) United States Patent
Hovhannisyan et al.

(10) Patent No.: US 10,651,622 B2
(45) Date of Patent: May 12, 2020

(54) MODAL INSTABILITY CONTROL IN FIBER LASERS

(71) Applicant: ELBIT SYSTEMS ELECTRO-OPTICS ELOP LTD., Rehovot (IL)

(72) Inventors: Grigor Hovhannisyan, Rehovot (IL); Zachary Sacks, Rehovot (IL)

(73) Assignee: ELBIT SYSTEMS ELECTRO-OPTICS ELOP LTD., Rehovot (IL)

( * ) Notice: Subject to any disclaimer, the term of this patent is extended or adjusted under 35 U.S.C. 154(b) by 0 days.

(21) Appl. No.: 16/327,866

(22) PCT Filed: Aug. 23, 2017

(86) PCT No.: PCT/IL2017/050942
§ 371 (c)(1),
(2) Date: Feb. 25, 2019

(87) PCT Pub. No.: WO2018/037413
PCT Pub. Date: Mar. 1, 2018

(65) Prior Publication Data
US 2019/0199053 A1  Jun. 27, 2019

(30) Foreign Application Priority Data
Aug. 25, 2016 (IL) .......................... 247506

(51) Int. Cl.
*H01S 3/102* (2006.01)
*H01S 3/067* (2006.01)
(Continued)

(52) U.S. Cl.
CPC .......... *H01S 3/1022* (2013.01); *H01S 3/0675* (2013.01); *H01S 3/09415* (2013.01);
(Continued)

(58) Field of Classification Search
CPC ............. H01S 3/10015; H01S 3/06729; H01S 3/0675; H01S 3/094003; H01S 3/1618; H01S 5/06804; H01S 3/102
(Continued)

(56) References Cited

U.S. PATENT DOCUMENTS 8,537,865 B1   9/2013  Shou
8,922,877 B1   12/2014 Goodno et al.
(Continued)

FOREIGN PATENT DOCUMENTS

WO   WO 2013/152862   10/2013

OTHER PUBLICATIONS

International Search Report of U.S. Appl. No. PCT/IL2017/050942, dated Dec. 12, 2017.
(Continued)

*Primary Examiner* — Tuan N Nguyen
(74) *Attorney, Agent, or Firm* — Pearl Cohen Zedek Latzer Baratz LLP

(57) ABSTRACT

Fiber lasers and methods are provided, in which the modal instability threshold is raised to provide more laser power. Fiber lasers comprise an active optical fiber having at least one absorption peak wavelength ($\lambda_{peak}$) and capable of supporting more than a fundamental mode during operation, and a plurality of pump diodes connected to deliver radiation emitted thereby into the optical fiber. At least one of the pump diodes is a wavelength-locked (WL) diode and at least one of the pump diodes is configured to deliver radiation at at least $\lambda \neq \lambda$(not necessarily the same diode(s)). The pump diodes may comprise any of WL diode(s) at $\lambda \neq \lambda_{peak}$, WL diode(s) at $\lambda = \lambda_{peak}$ and non-WL diode(s). Pumping radiation off the fiber's absorption peak increases the modal instability
(Continued)

threshold, most likely by reducing the temperature gradient in the active fiber at the fiber pump entrance point and along the fiber.

18 Claims, 7 Drawing Sheets

(51) Int. Cl.
| | |
|---|---|
| H01S 3/094 | (2006.01) |
| H01S 3/0941 | (2006.01) |
| H01S 5/068 | (2006.01) |
| H01S 5/14 | (2006.01) |
| H01S 5/40 | (2006.01) |
| H01S 3/16 | (2006.01) |

(52) U.S. Cl.
CPC .. *H01S 3/094003* (2013.01); *H01S 3/094096* (2013.01); *H01S 3/1618* (2013.01); *H01S 5/06804* (2013.01); *H01S 5/141* (2013.01); *H01S 3/09408* (2013.01); *H01S 5/4025* (2013.01)

(58) Field of Classification Search
USPC .............................................. 372/6; 385/123
See application file for complete search history.

(56) References Cited

U.S. PATENT DOCUMENTS

| 9,214,781 | B2 | 12/2015 | Honea et al. | |
|---|---|---|---|---|
| 2004/0207913 | A1 | 10/2004 | Mehuys et al. | |
| 2007/0236781 | A1* | 10/2007 | Fidric | H01S 3/09415 |
| | | | | 359/341.3 |
| 2010/0157418 | A1 | 6/2010 | Dong et al. | |
| 2011/0279891 | A1* | 11/2011 | Miyauchi | H01S 3/06758 |
| | | | | 359/341.3 |
| 2013/0278997 | A1* | 10/2013 | Liu | H01S 3/067 |
| | | | | 359/341.3 |
| 2015/0138630 | A1* | 5/2015 | Honea | H01S 3/06758 |
| | | | | 359/341.3 |

OTHER PUBLICATIONS

Tao et al.: "Mitigating of Modal Instabilities in Linearly-Polarized Fiber Amplifiers by Shifting Pump Wavelength", Journal of Optics vol. 17, No. 4, published on Mar. 27, 2015.
Tao et al.: "Study of wavelength dependence of mode instability based on a semianalytical model", IEEE Journal of Quantum Electronics, vol. 51, Issue: 8, pp. 1-6, Aug. 2015.
Khush et al.: "Threshold power and fiber degradation induced modal instabilities in high power fiber amplifiers based on large mode area fibers", Proc. SPIE 8961, Fiber Lasers XI: Technology, Systems, and Applications, 89611R (Mar. 12, 2014); doi:10.1117/12.2042261; http://dx.doi.org/10.1117/12.2042261.
K. Hejaz et al.: "Controlling mode instability in a 500W ytterbium-doped fiber laser", Laser Physics 24 (2014) 025102 (4pp).
Office action of IL patent application No. 247506, dated Aug. 20, 2017.

* cited by examiner

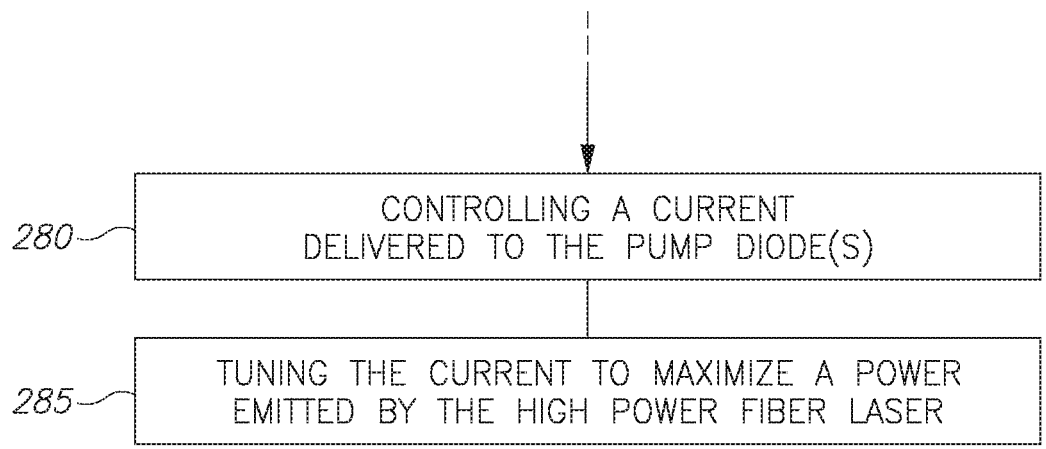
Figure 5 (cont. 1)

MODAL INSTABILITY CONTROL IN FIBER LASERS

CROSS-REFERENCE TO RELATED APPLICATIONS

This application is a National Phase Application of PCT International Application No. PCT/IL2017/050942, International Filing Date Aug. 23, 2017, entitled "MODAL INSTABILITY CONTROL IN FIBER LASERS", published on Mar. 1, 2018, under publication No. WO 2018/037413, which claims priority of Israel Patent Application No. 247506, filed on Aug. 25, 2016, all of which are hereby incorporated by reference in their entireties.

BACKGROUND OF THE INVENTION

1. Technical Field

The present invention relates to the field of fiber lasers, and more particularly, to increasing the modal instability threshold in high power fiber lasers.

2. Discussion of Related Art

Prior to setting forth the background of the related art, it may be helpful to set forth definitions of certain terms that will be used hereinafter.

The term "fiber laser" as used herein in this application, is defined as any optical device with an active optical fiber as the active gain medium that amplifies light through stimulated emission. The term "fiber laser" as used herein in this application, may refer to fiber lasers with any type of fiber laser cavities as well as to fiber amplifiers. By the above definition, a fiber laser would also include a master oscillator power amplifier (MOPA) fiber device including a non-fiber oscillator, e.g., a fiber coupled diode, and a fiber amplifier.

FIG. 1 schematically illustrates the phenomenon of modal instability, according to the prior art. A typical fiber laser 91 is pumped by diodes, via a coupler, to emit laser light (denoted by the arrow) and comprises high reflector (HR) and output coupler (OC) fiber Bragg gratings (FBGs) that define its cavity, as illustrated schematically in FIG. 1. One of the main power limits for high power fiber lasers is thermal modal instability (TMI or MI), which has been discovered relatively recently and whose exact physical explanation is still not precisely known. MI has also been extensively reported in fiber amplifiers, which have a similar structure to the oscillator depicted in FIG. 1, but without the FBGs and with an input signal to be amplified. By increasing the optical pump power from the diodes, the power of the laser increases until a certain point in which, as pump power is added, the power of the fundamental mode of the laser decreases as shown graph 91B due to modal instability. The laser power decreases above the MI threshold as the higher order modes are stripped off from the core in the fiber, a process shown schematically in 91C which depicts spatial profiles of the beam exiting the fiber laser without mode stripping. A beam that is normally single mode changes suddenly to have a temporally variable spatial multimode profile once the MI threshold pump power is crossed, and the normally single mode (stable) laser couples into higher order modes. Temporal changes on the order of a millisecond are seen in the spatial profile. The reason for the power reduction due to MI (91B) is that most high power lasers are built from few-mode fibers operating in a single mode (as the fundamental mode) which are coiled to remove the higher order modes, causing significant losses to the higher order modes. Once modal instability occurs in such a fiber laser, the light from the fundamental mode (left-hand side of diagram 91C) is transferred to higher order modes (right-hand side of diagram 91C), and the coil strips these higher order modes from the core of the fiber—and the stripped energy is not delivered to the output of the laser.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a fiber laser comprising an active optical fiber having at least one absorption peak wavelength ($\lambda_{peak}$), and a plurality of pump diodes connected to deliver radiation emitted thereby into the optical fiber, wherein at least one of the pump diodes is a wavelength-locked (WL) diode and wherein at least one of the pump diodes is configured to deliver radiation at at least $\lambda \neq \lambda_{peak}$.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
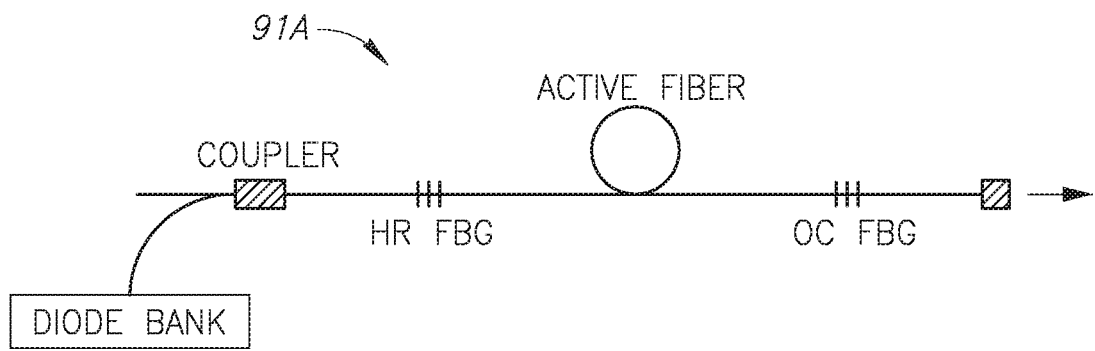
FIG. 1 schematically illustrates the phenomenon of modal instability, according to the prior art.
Figure 1:
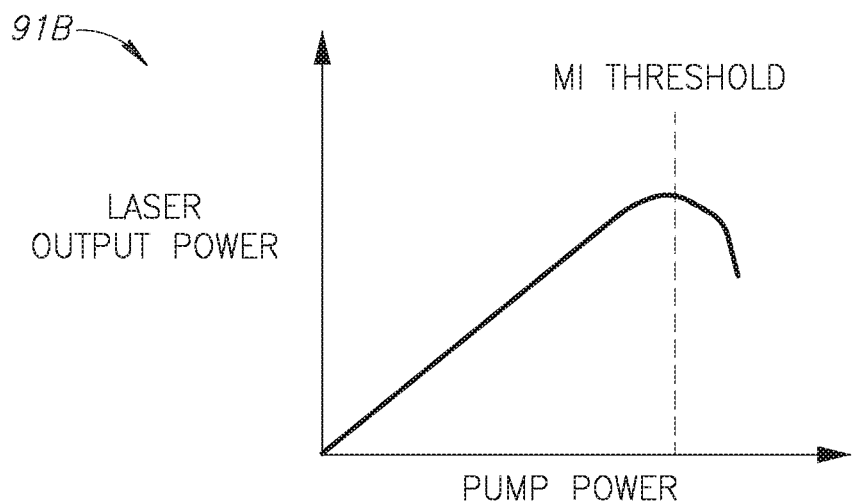
Figure 1:
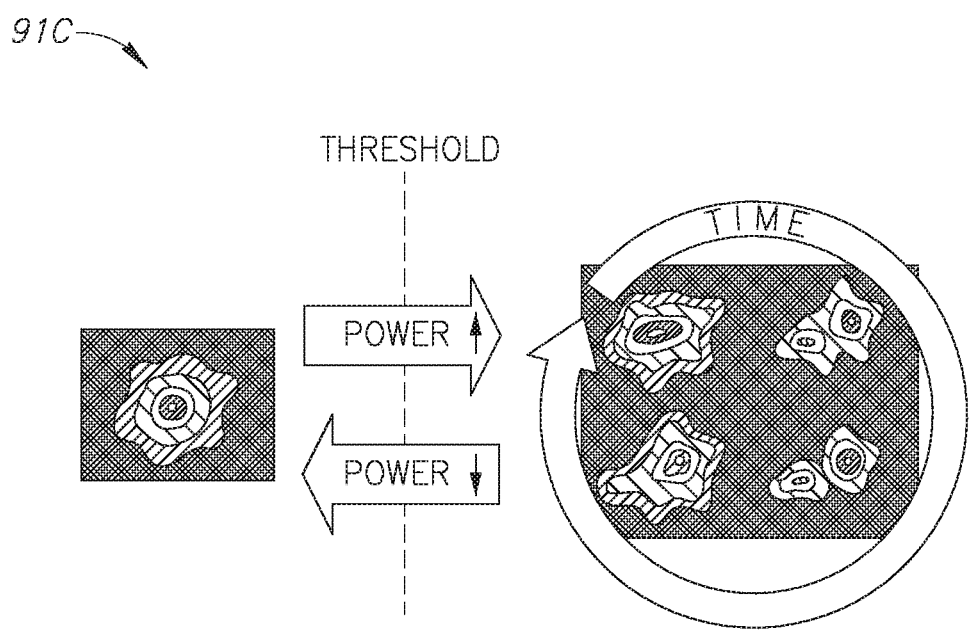

Prior to the detailed description being set forth, it may be helpful to set forth definitions of certain terms that will be used hereinafter.

The term "wavelength-locked (WL) diode" as used in this application refers to a diode having a narrow and stable emission spectrum, e.g., one having a well-defined peak wavelength λ typically within ±1 nm of the specifications and a spectral width of less than 2 nm. Examples of such devices include Nlight's e18.135976105, BWT's K976AA5RN-60.00W, or IPG's PLD-70-975-WS diodes. The term "non-wavelength-locked (non-WL) diode" as used in this application refers to a diode having a broad and unstable emission spectrum, e.g., one having a peak wavelength λ typically within 5 nm of specifications and peak width of about less than 10 nm. Examples of such devices include Nlight's e18.1050976105, BWT's K976FA5RN-70.00W, or Dilas' IS43 diodes. The difference between these two diode types is that the wavelength locked diodes have a wavelength locking element such as a volume Bragg grating (VBG) or fiber Bragg grating (FBG) to provide external feed back into the laser diode in order to define the spectral peak. WL diodes often have a fixed spectrum over a large range of pump currents and temperatures. For example, a typical single emitter diode has a peak wavelength shift of 1 nm per ampere of pump current and a 0.3 nm shift per degree centigrade of temperature. A wavelength locked diode has almost no peak wavelength shift over the operating current and operating temperature ranges.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Fiber lasers and methods are provided, in which the modal instability threshold is raised to provide more laser power. Fiber lasers comprise an active optical fiber having at least one absorption peak wavelength ($\lambda_{peak}$) and capable of supporting more than a fundamental mode during operation, and a plurality of pump diodes connected to deliver radiation emitted thereby into the optical fiber. In embodiments, at least one of the pump diodes is a wavelength-locked (WL) diode and at least one of the pump diodes is configured to deliver radiation at at least $\lambda \neq \lambda_{peak}$ (not necessarily the same diode(s)). The pump diodes may comprise any of WL diode(s) at $\lambda \neq \lambda_{peak}$, WL diode(s) at $\lambda = \lambda_{peak}$ and non-WL diode(s). The inventors discovered, as disclosed herein, that pumping radiation off the fiber's absorption peak, by at least some of the diodes, increases the modal instability threshold (with respect to a base MI threshold of the active optical fiber when pumped only by WL diodes at $\lambda_{peak}$), most likely (but without being bound by theory) by reducing the temperature gradient in the active fiber at the fiber pump entrance point and along the fiber. It is noted that the prior art does not use detuned wavelength locked diodes or a combination of WL and non-WL diodes, possibly tuned to different wavelength peaks.

One of the limits of high power fiber lasers is modal instability (MI), which may occur when high power is required in single mode operation and under design constraints that determine the fiber type, fiber length, and pumping wavelength, e.g., to minimize other nonlinear effects such as SRS (stimulated Raman scattering) and spectral broadening by making the fiber short. As the fiber becomes shorter (while maintaining efficient pump absorption), the thermal gradients, mainly of pump absorption, become larger and result in a lower modal instability threshold and as a result lower laser power. One way to control MI via the thermal gradient from the pump diodes is to control the pump diode spectra. Currently, diodes in the market are either broadband without a well-defined center or narrow band at the absorption peak.

Figure 2A:
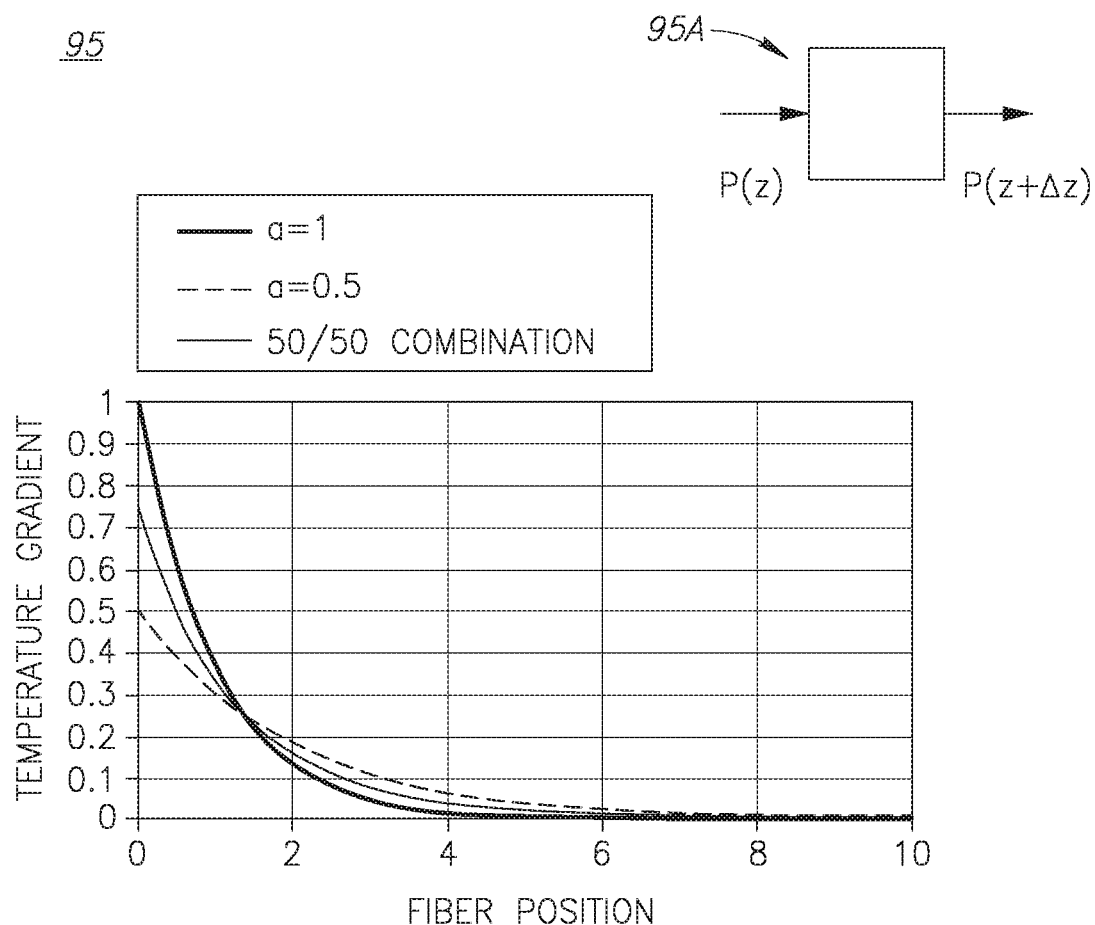
FIG. 2A is a schematic analysis of the modal instability phenomenon, according to some embodiments of the invention.

FIG. 2A is a schematic analysis of the modal instability phenomenon, according to some embodiments of the invention. The MI threshold is related to the thermal gradient along the length of the fiber resulting from the absorption of pump light in the core of the fiber. Light is absorbed according to Beer's law in the low inversion approximation as $P(z)=P_0\exp(-\alpha z)$, with $P_0$ being the input power, $P(z)$ being the power along the length of the fiber at position z and α being the absorption coefficient. The amount of power absorbed $P_{abs}$ in a given length $\Delta z$ is given by $$P_{abs}(z) = \frac{P(z) - P(z+\Delta z)}{\Delta z} = -\frac{\partial P(z)}{\partial z}$$

(see schematic illustration 95A of an infinitesimal length of fiber). Assuming that the rise in temperature is proportional to the heat deposited, which is generally proportional to the pump power absorption multiplied by the quantum defect $\eta_{QE}$ (lasing signal photon energy divided by the pump photon energy) then the thermal gradient is given by $$\frac{\partial T}{\partial z} \propto -\eta_{QE} \frac{\partial P_{abs}}{\partial z}$$

As the thermal gradient is the strongest at the fiber entrance, z=0, the thermal gradient at the fiber entrance simplifies to $$\left.\frac{\partial T}{\partial z}\right|_{z=0} \propto -\eta_{QE}\alpha P_o.$$

Therefore, the inventors deduced, the MI threshold may be increased by decreasing the thermal gradient, e.g., by decreasing the effective absorption coefficient (α) of the pump in the fiber. The effective absorption coefficient is the weighted average absorption of the pump spectrum within a given fiber.

Graph 95 in FIG. 2A schematically exemplifies the thermal gradient along a fiber with different effective absorption coefficients, α=1 and α=0.5, resulting from a corresponding selection of the wavelengths of the diodes at different absorption values in the active fiber. Assuming that these absorption coefficients correspond to different pump diode wavelengths with different absorption coefficients in the fiber, it can be observed that the highest thermal gradient occurs at the pump entrance to the fiber and that the higher the absorption coefficient α, the higher the temperature gradient. Therefore, the MI threshold for α=1 is expected be about a half of the MI threshold for α=0.5. When using as pump diodes both types of diodes at equal proportions (marked 50/50 combination in graph 95), the MI threshold is expected to be about 50% higher than the MI threshold for α=1, providing an advantage for mixing diodes with different wavelengths. Moreover, diodes at specific wavelengths may be selected to decrease the thermal gradient depending on the specific absorption spectrum of the active fiber.

Figure 2B:
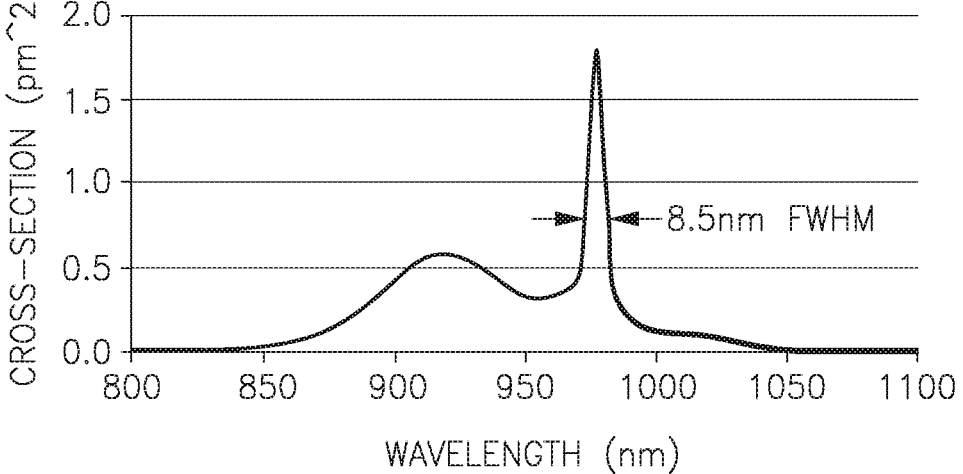
FIG. 2B schematically exemplifies the absorption cross section of Yb (Ytterbium):silica.

Graph 97A in FIG. 2B schematically exemplifies the absorption cross section of Yb (Ytterbium):silica in a phospho-aluminosilicate matrix. Roughly speaking, if the absorbed power of the fiber should remain constant, as in good practice designs, then the fiber length is inversely proportional to the absorption cross-section. For example, a fiber laser being pumped at 972 nm would have a length about two times longer a fiber laser being pumped at the 976 nm peak.

As described herein, the spectra of the pumping diodes may be selected to increase the modal instability threshold by changing the effective absorption length of the pump in the fiber and decreasing the thermal gradient. For example, the wavelength of a pump diode may be tuned off peak by using a different VBG (volume Bragg grating) at an off-peak wavelength (e.g., working at 974 nm). Using a VBG off-peak provides the advantage of a fixed diode spectrum over the diode's operating current and temperature ranges. In certain embodiments, the effective absorption length may be increased by using standard WL diodes at the peak absorption wavelength in combination with non-WL diodes having broader spectral widths and peaks that may or may not be aligned to the fiber absorption peak. In certain embodiments, diodes in different bands may be selected, such as 915 nm and 976 nm in Yb:silica. In certain embodiments, in order to further adjust the absorption of the pumped radiation, the non-WL diode temperature and/or current may be used to move the central wavelength with respect to the peak absorption wavelength. As discovered by the inventors, using a combination of diode spectra enables to control the modal instability and prevents catastrophic failure of the laser by higher order mode stripped power burning the laser. Moreover, the disclosed analysis and embodiments enable using standard COTS (commercial off the shelf) diodes as well as diodes at other wavelengths and/or broad bandwidth diodes to be used in combination with other diodes, e.g., wavelength locked diodes (in a non-limiting example, using 973 nm and 976 nm wavelength locked diodes).

Figure 3:
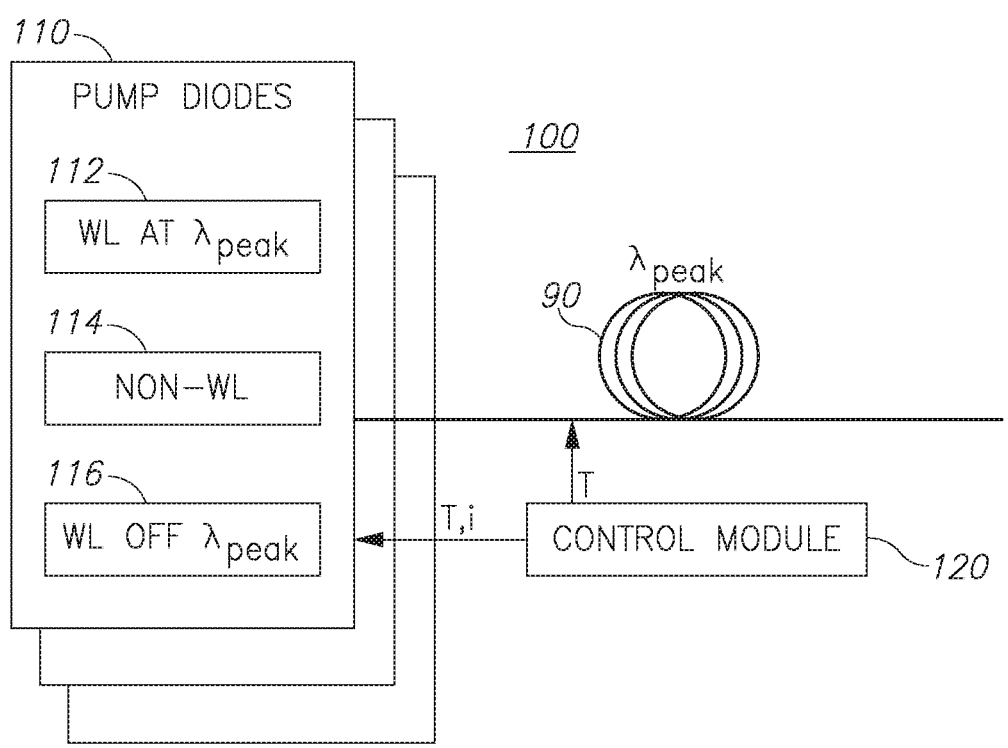
FIG. 3 is a high level schematic block diagram of a fiber laser, according to some embodiments of the invention.

FIG. 3 is a high level schematic block diagram of a fiber laser 100, according to some embodiments of the invention. Fiber laser 100 comprises an active optical fiber 90 having at least one absorption peak wavelength ($\lambda_{peak}$) capable of supporting more than a fundamental mode during operation, and a plurality of pump diodes 110 connected to deliver radiation emitted thereby into optical fiber 90. At least one of pump diodes 110 is configured to deliver radiation at $\lambda \neq \lambda_{peak}$. In operation, the modal instability (MI) threshold of fiber laser 100 is higher than a base MI threshold of active optical fiber 90 when pumped only by WL diodes at $\lambda_{peak}$ (taught by the prior art in order to maximize absorption).

Fiber lasers 100 may comprise high power lasers 100 configured to operate at an output power higher than 400 W, >500 W, >1000 W, >1500 W, >2000 W etc. the active optical fiber comprises at least one of: an all-glass LMA (large mode area) type optical fiber with a core diameter >15 μm or >20 μm, a LMA fiber with coiling for mode stripping, a photonic crystal active fiber and a photonic bandgap structure fiber. A high power fiber laser (not shown explicitly) may comprise at least one fiber laser 100, combined with at least one additional fiber laser by spectral beam combining, coherent beam combining and/or incoherent beam combining.

For example, pump diodes 110 may comprise any of the following combinations: (i) at least one wavelength-locked (WL) diode at $\lambda \neq \lambda_{peak}$ 116; (ii) at least one wavelength-locked (WL) diode at $\lambda = \lambda$ 112 and at least one non-WL diode 114; and (iii) at least one wavelength-locked (WL) diode at $\lambda \neq \lambda_{peak}$ 116 and at least one non-WL diode 114. In certain embodiments, most or even all pump diodes 110 may comprise WL diodes.

Non-WL diode(s) 114 may have a peak at $\lambda = \lambda_{peak}$ and/or may have a wavelength range that includes peak, or even, in certain embodiments, a wavelength range that does not include $\lambda_{peak}$. In any of the listed options, radiation is delivered into active optical fiber 90 and wavelengths different from $\lambda_{peak}$ operatively reduce the modal instability of the delivered radiation, as explained herein.

For example, in a non-limiting case of a Yb:silica fiber, WL diodes 112 may be at $\lambda = \lambda_{peak}$=976 nm and/or WL diodes 116 may be at $\lambda \neq \lambda_{peak}$=976 nm (e.g., λ=9xx). Non-WL diodes 114 may be may be tuned in current and/or temperature to move their central peak, as explained below, or be used without tuning. It is noted that in certain embodiments, common 976 nm WL diodes 112 and non-WL diodes 114 may be used to increase the effective absorption length of the fiber to decrease modal instability.

Figure 4A:
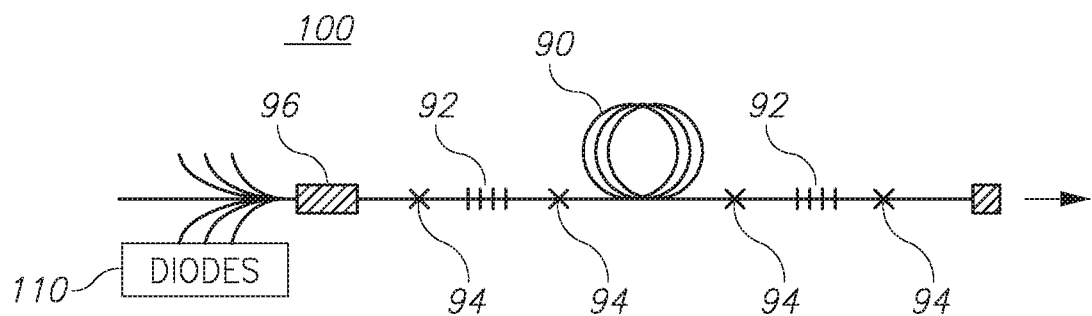
FIGS. 4A-4C are high level schematic illustrations of an experimental setup and results for fiber lasers, according to some embodiments of the invention.
Figure 4B:
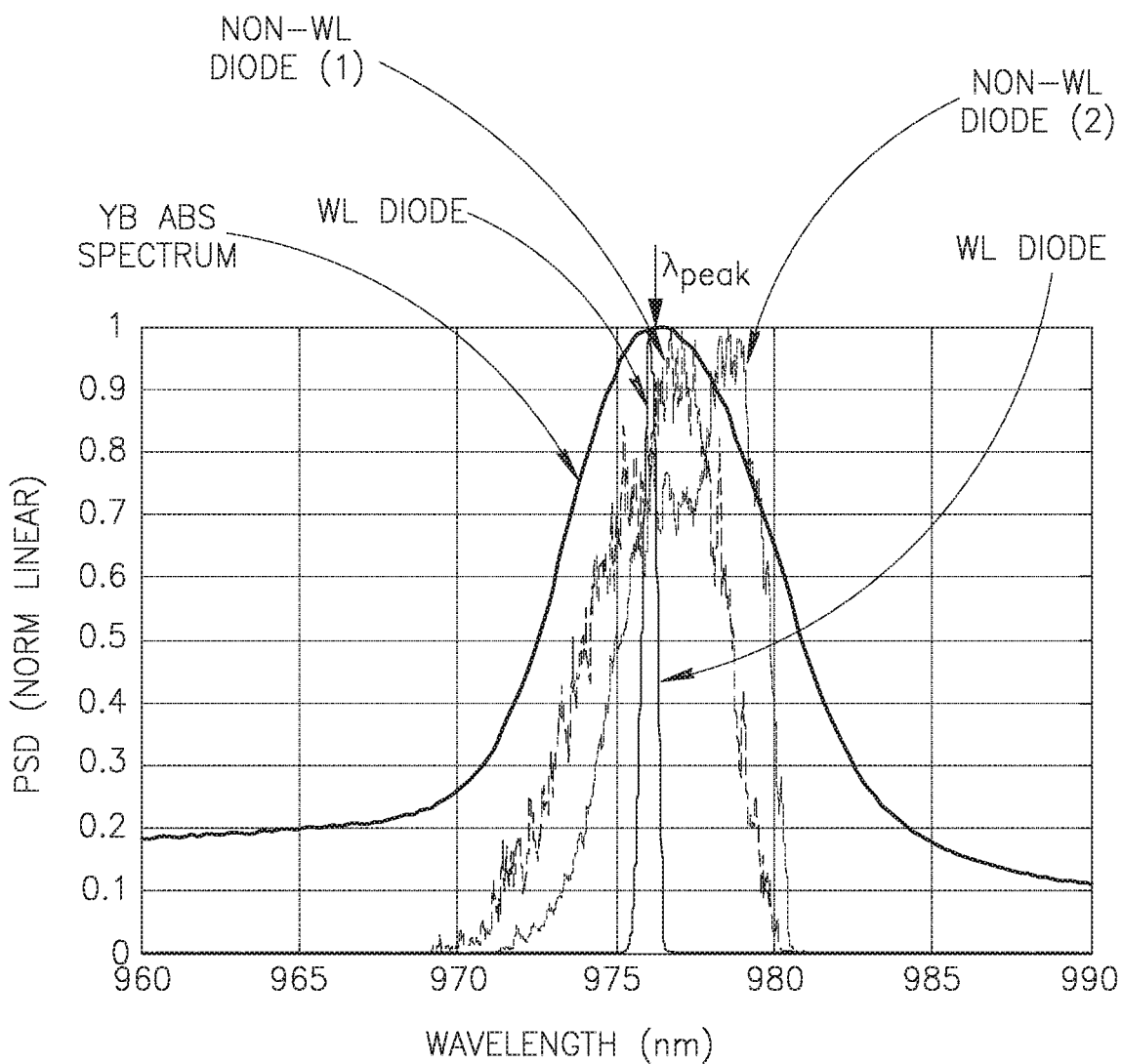
Figure 4C:
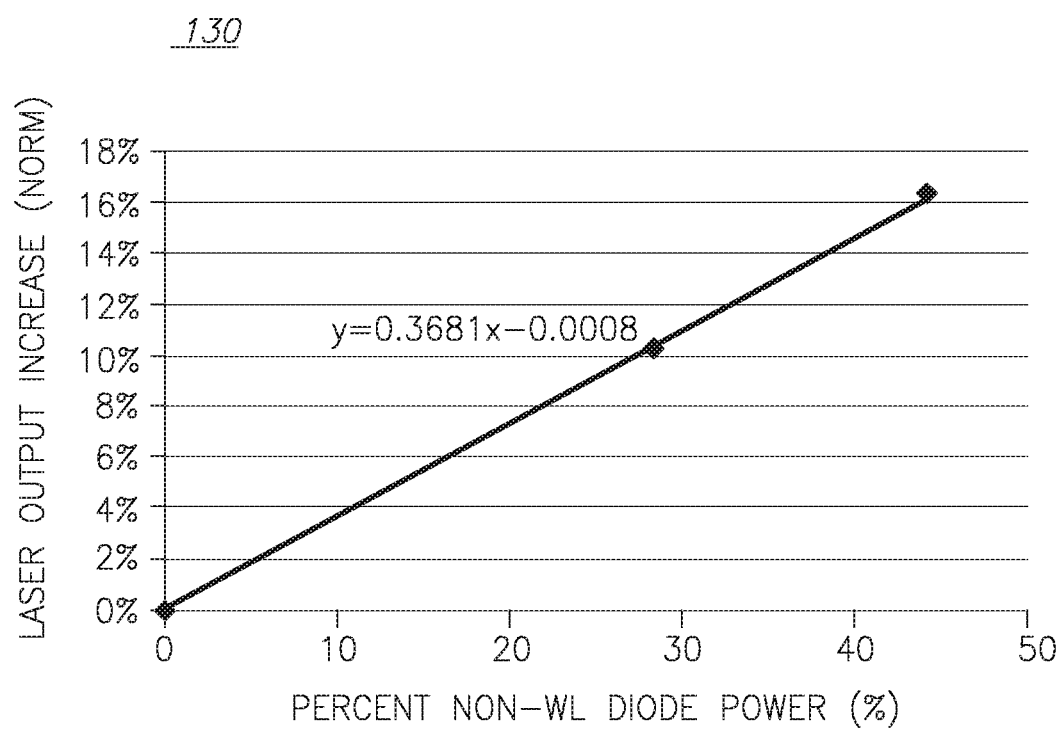

Fiber laser 100 may further comprise a control module 120 configured to control a temperature (T) of at least one of pump diodes 110. Control module 120 may be configured to tune the temperature to maximize a power emitted by fiber laser 100. Fiber laser 100 may further comprise a control module 120 configured to control a current (i) delivered to at least one of pump diodes 110. Control module 120 may be configured to tune the current to maximize a power emitted by fiber laser 100. FIGS. 4A-4C are high level schematic illustrations of an experimental setup and results for fiber laser 100, according to some embodiments of the invention.

FIG. 4A schematically illustrates experimental fiber 100, comprising a length of LMA-YDF-20/400 active fiber between two FBGs (fiber Bragg gratings) 92, incorporated in fiber 90 at splices 94. The cavity was end pumped from the HR FBG side with varying combinations of diodes 110 (connected to fiber 90 via a coupler 96). Fiber laser 100 was used to check the effect of diode spectra on the modal instability threshold.

Graph 97B in FIG. 4B schematically illustrates fiber 90's absorption curve (normalized PSD—power spectral density, effective absorption cross-sections with respect to Yb absorption cross section of $1.78 \cdot 10^{-24}$ m$^2$) with a peak at a $\lambda_{peak}$, the emission spectrum of a WL diode with a narrow peak (illustrated in a non-limiting manner at λ=976 nm=$\lambda_{peak}$, yet WL diodes having narrow peaks at $\lambda \neq \lambda_{peak}$ may be used in at least some embodiments), the emission spectra of two different non-WL diodes (1) and (2), both having relatively wide peaks at $\lambda \neq \lambda_{peak}$ (illustrated in a non-limiting manner at $\lambda \neq \lambda_{peak}$, non-WL diodes having peaks at $\lambda = \lambda_{peak}$ may be used in at least some embodiments). It is noted that non-WL diodes (1) and (2) may differ due to production processes and arbitrary factors, and the difference may depend e.g., on the batch of diodes used. The spectra of the non-WL diodes may be tuned by the operating temperature and/or by the drive current in order to achieve an optimal overlap with the active fiber absorption spectrum. The effective absorption cross-section of the WL diode, calculated as an overlap integral of the diode spectra with respect to the absorption cross-section of the active fiber, was similar to the fiber ($1.78 \cdot 10^{-24}$ m$^2$) while the absorption cross-section of the non-WL diodes ($1.56 \cdot 10^{-24}$ m$^2$) was about 12.5% lower than that of the WL diode and the fiber.

FIG. 4C schematically illustrates experimental results for the modal instability threshold with WL diodes only (0% non-WL diode power), with ca. 30% non-WL diodes of (see FIG. 4B) and with ca. 45% non-WL diodes see FIG. 4B, all percentages with respect to power output of the diodes. The modal instability threshold in each case was found by adding wavelength locked diodes until modal instability was reached. As seen in FIG. 4C, the modal instability threshold increases linearly with the non-wavelength locked diode pump power.

The result presented in FIG. 4C is surprising, as more and more power is pumped into the fiber, yet the modal instability threshold increases The inventors refer to FIG. 2A and the respective derivation as a possible explanation of the result, yet the invention is not limited by or dependent upon the validity of that explanation. Continuing from the derived expression for the thermal gradient at the fiber entrance, $$\left.\frac{\partial T}{\partial z}\right|_{z=0} \propto -\eta_{QE}\alpha P_o,$$

derived above, a case with more than one pump spectrum, as illustrated in FIG. 4A, may described by $$\left.\frac{\partial T}{\partial z}\right|_{z=0} \propto \alpha_1 P_1 + \alpha_2 P_2 = M_{th},$$

with $\alpha_1$ and $\alpha_2$ denoting the respective effective absorption coefficients and $P_1$, $P_2$ denoting the input power of two types of pump diodes. $M_{th}$ denotes the thermal slope in which the modal instability occurs. Thus, by changing the absorption coefficients and powers, the modal instability threshold can be adjusted. Table 1 shows the results using the simplified model. Each line shows the power increase for a combination of WL diodes and non-WL diodes. The $M_{th}$ calc was obtained by calculating the effective absorptions and powers. In each case, $M_{th}$ was approximately constant as would be expected by the model.

TABLE 1

Modal instability threshold calculation

| Laser output Power | WL Pump | nonWL Pump | $M_{th}$ calc |
|---|---|---|---|
| 100% | 100% | 0% | 1 |
| 106% | 79% | 27% | 0.99 |
| 116% | 66% | 44% | 1.03 |

Figure 5:
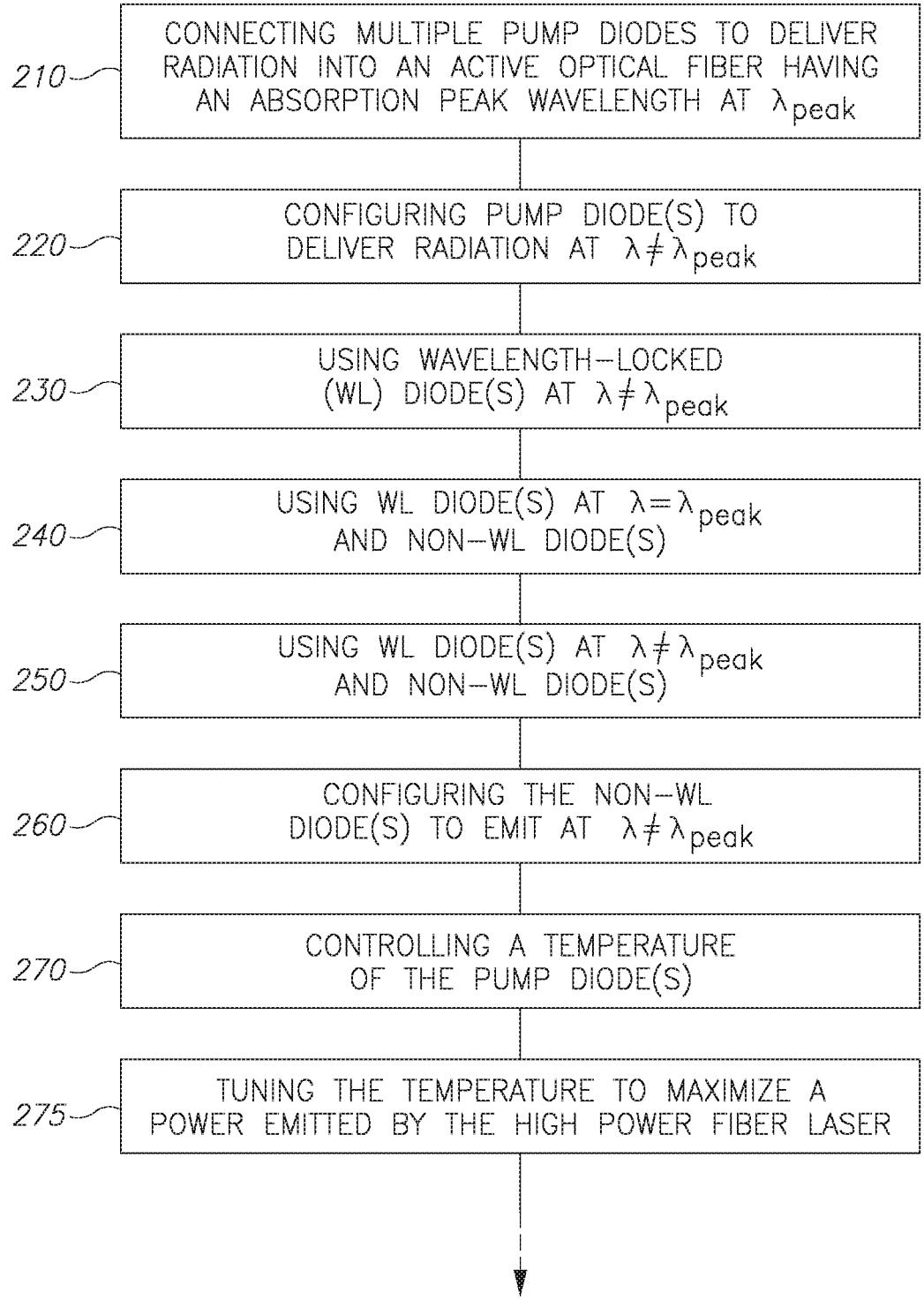
FIG. 5 is a high level flowchart illustrating a method, according to some embodiments of the invention.

FIG. 5 is a high level flowchart illustrating a method 200, according to some embodiments of the invention. The method stages may be carried out with respect to fiber laser 100 described above, which may optionally be configured to implement method 200. Method 200 may comprise any of the following stages.

Method 200 may comprise connecting a plurality of pump diodes to deliver radiation emitted thereby into an active optical fiber having at least one absorption peak wavelength ($\lambda_{peak}$) (stage 210), capable of supporting more than a fundamental mode during operation, and configuring at least one of the pump diodes to deliver radiation at $\lambda \neq \lambda_{peak}$ (stage 220). At least one of the pump diodes may be a wavelength-locked (WL) diode.

The active optical fiber may be configured to operate at an output power higher than 400 W (or higher than any of 500 W, 1000 W, 1500 W or 2000 W, etc.) and, in operation, have a modal instability (MI) threshold that is higher than a base MI threshold of the active optical fiber when pumped only by WL diodes at $\lambda_{peak}$.

Method 200 may comprise using at least one WL diode at $\lambda \neq \lambda_{peak}$ as the at least one pump diode (stage 230). Method 200 may comprise using at least one WL diode at $\lambda = \lambda_{peak}$, and at least one non-WL diode as the at least one pump diode (stage 240). Method 200 may comprise using at least one WL diode at $\lambda \neq \lambda_{peak}$ and at least one non-WL diode as the at least one pump diode (stage 250). Method 200 may comprise configuring the at least one non-WL diode to have a wavelength range than includes $\lambda_{peak}$ and/or to have a wavelength range than does not include $\lambda_{peak}$ (stage 260). The WL diode(s) and the non-WL diode(s) may be configured to have different center wavelengths. Method 200 may comprise controlling a temperature of at least one of the pump diodes (stage 270), e.g., tuning the temperature to maximize a power emitted by fiber laser (stage 275); and/or controlling a current delivered to at least one of the pump diodes (stage 280), e.g., tuning the current to maximize a power emitted by the fiber laser (stage 285).

Configuring at least one of the pump diodes to deliver radiation at $\lambda \neq \lambda_{peak}$ (stage 220) may comprise tuning a temperature of the respective pump diode(s), tuning a current supplied to the respective pump diode(s) and/or selecting a WL diode at $\lambda \neq \lambda_{peak}$ as the respective pump diode(s).

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A fiber laser comprising:
an active optical fiber having at least one absorption peak wavelength ($\lambda_{peak}$), capable of supporting more than a fundamental mode during operation, and
a plurality of pump diodes connected to deliver radiation emitted thereby into the optical fiber, wherein at least one of the pump diodes is a wavelength-locked (WL) diode, wherein at least one of the pump diodes is a non-WL diode, having different center wavelengths and wherein at least one of the pump diodes is configured to deliver radiation at at least $_{peak}$,
wherein the fiber laser is configured to operate at an output power higher than 400 W, and
wherein, in operation, a modal instability (MI) threshold of the fiber laser is higher than a base MI threshold of the active optical fiber when pumped only by WL diodes at $\lambda_{peak}$.

2. The fiber laser of claim 1, wherein the active optical fiber comprises at least one of: an all-glass LMA (large mode area) type optical fiber with a core diameter >15 μm, a LMA fiber with coiling for mode stripping, a photonic crystal active fiber and a photonic bandgap structure fiber.

3. The fiber laser of claim 1, wherein the output power is higher than 1000 W.

4. The fiber laser of claim 1, wherein the pump diodes comprise at least one WL diode at $\lambda=\lambda_{peak}$.

5. The fiber laser of claim 1, wherein the pump diodes comprise at least one WL diode at $\lambda\neq\lambda_{peak}$.

6. The fiber laser of claim 1, wherein the at least one non-WL diode has a wavelength range that includes $\lambda_{peak}$.

7. The fiber laser of claim 1, wherein the at least one non-WL diode has a wavelength range that does not include $\lambda_{peak}$.

8. The fiber laser of claim 1, wherein the pump diodes comprise at least one WL diode at $\lambda\neq\lambda_{peak}$.

9. The fiber laser of claim 8, wherein all the pump diodes are WL diodes.

10. The fiber laser of claim 1, further comprising a control module configured to control a temperature of at least one of the pump diodes.

11. The fiber laser of claim 10, wherein the control module is further configured to tune the temperature to maximize a power emitted by the fiber laser.

12. The fiber laser of claim 1, further comprising a control module configured to control a current delivered to at least one of the pump diodes.

13. The fiber laser of claim 12, wherein the control module is further configured to tune the current to maximize a power emitted by the fiber laser.

14. A method comprising:
connecting a plurality of pump diodes to deliver radiation emitted thereby into an active optical fiber having at least one absorption peak wavelength ($\lambda_{peak}$) and capable of supporting more than a fundamental mode during operation, wherein at least one of the pump diodes is a wavelength-locked (WL) diode, wherein at least one of the pump diodes is a non-WL diode having different center wavelengths, and
configuring at least one of the pump diodes to deliver radiation at $\lambda\neq\lambda_{peak}$,
wherein the active optical fiber is configured to operate at an output power higher than 400 W, and, in operation, a modal instability (MI) threshold of the active optical fiber is higher than a base MI threshold of the active optical fiber when pumped only by WL diodes at $\lambda_{peak}$.

15. The method of claim 14, further comprising using at least one WL diode at $\lambda=\lambda_{peak}$.

16. The method of claim 14, further comprising using at least one WL diode at $\lambda\neq\lambda_{peak}$.

17. The method of claim 15, further comprising configuring the at least one non-WL diode to have a wavelength range than includes $\lambda_{peak}$.

18. The method of claim 15, further comprising configuring the at least one non-WL diode to have a wavelength range than does not include $\lambda_{peak}$.

* * * * *